United States Patent [19]

Pilbrow et al.

[11] Patent Number: 4,803,624

[45] Date of Patent: Feb. 7, 1989

[54] ELECTRON SPIN RESONANCE SPECTROMETER

[76] Inventors: John R. Pilbrow, 12 Ellicott Crescent, Dingley, Victoria 3172; Gordon J. F. Troup, 132 Canterbury Road, Canterbury, Victoria 3126; Anatol Z. Tirkel, 21 Walstrab Street, East Brigthon, Victoria 3187; Donald R. Hutton, 30 Guest Road, South Oakleigh, Victoria 3167; Lucian Gruner, 3 Mont Albert Road, Cantebury, Victoria 3126; Neil R. McLaren, 11/32 Marne Street, South Yarra, Victoria 3141, all of Australia

[21] Appl. No.: 73,213

[22] Filed: Jul. 14, 1987

[30] Foreign Application Priority Data

Sep. 19, 1986 [AU] Australia .............................. PH08127

[51] Int. Cl.[4] .......................................... G01R 33/20
[52] U.S. Cl. .................................... 324/316; 324/300
[58] Field of Search ................ 333/219; 324/316, 317, 324/300

[56] References Cited

U.S. PATENT DOCUMENTS

| | | | |
|---|---|---|---|
| 3,243,700 | 3/1966 | McAvoy et al. | 324/316 |
| 3,350,633 | 10/1967 | Hyde | 324/316 |
| 3,448,374 | 6/1969 | Heuer | 324/316 |
| 3,714,550 | 1/1973 | Hyde | 324/316 |
| 3,798,532 | 3/1974 | Hausser | 324/316 |
| 3,931,569 | 1/1976 | Hyde | 324/316 |
| 4,314,204 | 2/1982 | Biehl | 324/316 |
| 4,360,776 | 11/1982 | Bauman | 324/316 |
| 4,593,248 | 6/1986 | Hyde et al. | 324/317 |
| 4,623,835 | 11/1986 | Mehdiazadeh | 324/316 |

OTHER PUBLICATIONS

Kangelberg et al., "MIC-Mischer fur Homodyn-Mikrowellenstrecken in EPR-Spektrometern" (MIC Mixers for Homodyne Microwave Routes in EPR Spectrometers), Eletronik, vol. 31, pp. 148-153, 1981.

Denisov, "A Block for Electronic Digital Sweep of a Magnetic Field for Microwave Electron Paramagnetic Resonance Spectrometers," Instruments and Experimental Techniques, vol. 19(1), Part 2, Jan.-Feb., 1976, pp. 291-293.

*Primary Examiner*—Michael J. Tokar
*Attorney, Agent, or Firm*—Finnegan, Henderson, Farabow, Garrett & Dunner

[57] ABSTRACT

An electron spin resonance spectrometer is disclosed which includes a sample and a reference arm (16, 18). The sample arm has a circulator (30) for directing radiation to a resonator (22) in which a sample for analysis is deposited and for receiving radiation from the resonator and directing it to a detector (32). The detector detects the microwave radiation from the sample and reference arms (16, 18) to determine a property or properties of said sample. The sample arm (16) and said reference arm (18) are formed as an integrated microwave bridge which includes a divider (14) having a first output portion coupled to an attenuator (20), said attenuator being coupled to said circulator (30) by a microwave transmission line (110). The circulator (30) is coupled to at least one output by a second microwave transmission line (124). The divider (14) has a second output portion coupled to a phase shifter (36), said phase shifter including a second circulator (73) and a second attenuator (38) including a third circulator (81), said second circulator (73) being coupled to said third circulator (81) by a third microwave transmission linne (80), a fourth microwave transmission line (90) coupling an output of said third circulator (81) to at least one second output.

22 Claims, 6 Drawing Sheets

ELECTRON SPIN RESONANCE SPECTROMETER

FIELD OF THE INVENTION

This invention relates to an electron spin resonance spectrometer.

DESCRIPTION OF THE RELATED ART

Electron Spin Resonance (ESR), sometimes called Electron Paramagnetic Resonance (EPR), is the resonant absorption of microwave radiation by a paramagnetic system placed in a magnetic field.

Applications of ESR are to be found in physics (metal ions in crystals and powders), chemistry (crystals, chemical complexes in solution, free radicals and chemical reactions), biochemistry (particularly heme proteins, non-heme iron proteins, copper proteins, the use of metal substitution such as cobalt in place of zinc in zinc enzymes and by means of spin labelling of biological molecules including proteins and membrane components), natural materials (naturally occurring radicals and trace metal ions in coal and metal complexes in petroleum), gemmology (e.g. distinguishing between natural and synthetic sapphires using a method developed by Dr. Hutton and Troup, co-inventors of the present invention), glass technology (magnetic ions in glasses and structural disorder). Other areas in which considerable development is possible include clinical medicine, testing for production of free radicals in gamma-irradiated food and in archaeometry.

Electron Spin Resonance (ESR), often called Electron Paramagnetic Resonance (EPR), is most often carried out at a fixed microwave frequency, e.g., 9 to 10 GHz, and spectra recorded as a function of an applied magnetic field. The microwave circuit is usually built around waveguide components and is therefore bulky. Research spectrometers have magnets typically weighing 1 to 3 tons. Thus ESR spectometers are not readily portable. Even the smaller bench-top models which have been commercially available for 15 to 20 years are too heavy to be moved about.

It has recently been recognized that low microwave frequencies (1 to 4 GHz) provide improved resolution of spectra due to transition ions such as copper (II), cobalt (II) and molybdenum (V) as well as for samples of biological interest. Applications of low microwave frequencies (1 to 4 GHz) to ESR have benefited from a rediscovery in 1981 of an old principle of the side resonators which were incorporated in magnetron design at least as early as 1941 (Collins MIT Radiation Laboratory Series Volume 6 (1948)) and now referred to in the ESR literature as split-ring or loop-gap resonators, which take the place of resonant sample cavities. In its simplest form such a resonator is a conducting cylinder with a capacitive slit along one side. By means of such resonators, sample volumes can be maintained at the levels presently used at 9 GHz with perhaps 2 to 3 times lower sensitivity. This makes ESR at 1 to 4 GHz a feasible proposition on a routine basis. Loop-gap resonators constructed from a machinable ceramic (MACOR, made by Corning Glass Co.) and then electroplated, are easily made for use in the 2 to 4 GHz range.

The proposed microwave bridge and ESR spectrometer is not restricted to operation with the described resonators but may be used with any suitable sample resonant microwave structure.

SUMMARY OF THE INVENTION

The object of this invention is to provide a relatively low cost portable spectrometer which can operate somewhere in the 2 to 3 GHz range.

The invention provides an electron spin resonance spectrometer having a microwave source for providing microwave radiation to a sample and a reference arm, said sample arm having a circulator for directing radiation to a resonator in which a sample for analysis is deposited and for receiving radiation from the resonator and directing it to a detector, said detector detecting said microwave radiation from the sample and reference arms to determine a property or properties of said sample, characterised in that said sample arm and said reference arm are formed as an integrated microwave bridge.

Since the components are formed as an integrated microwave bridge, the spectrometer will be inexpensive and the components can be incorporated to thereby provide a spectrometer which is light and therefore easily portable and which is capable of operating in the 2 to 3 GHz range.

Preferably the spectrometer includes an isolator for receiving radiation from the microwave source to prevent reflected radiation from returning to the source, a divider for directing some of said radiation to the sample and reference arms, an attenuator arranged in the sample arm between the divider and the circulator; a phase shifter and an attenuator arranged in the reference arm between the divider and the detector. A single ended or balanced mixer can be connected between the sample and reference arms as the detector.

BRIEF DESCRIPTION OF THE DRAWINGS

A preferred embodiment of the invention will be described in more detail with reference to the accompanying drawings in which.

DETAILED DESCRIPTION OF THE PREFERRED EMBODIMENT

Figure 1:
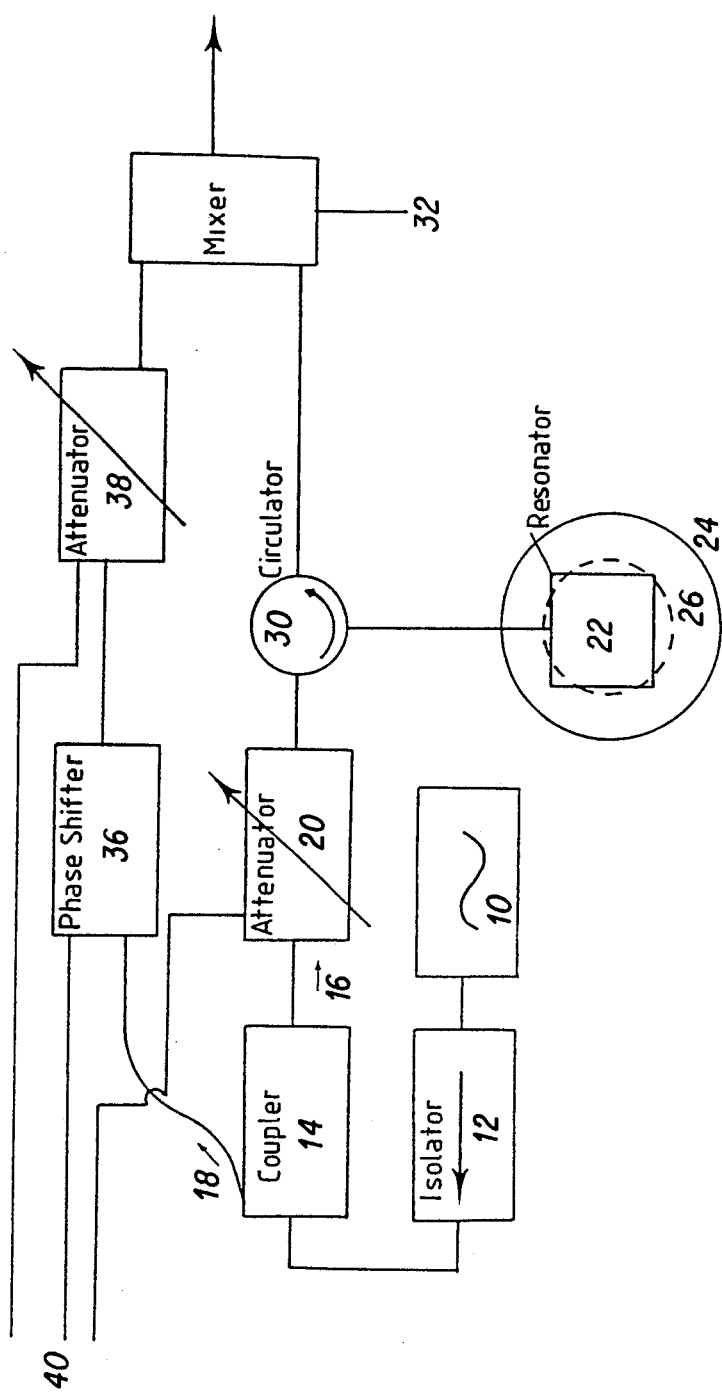
FIG. 1 is a block diagram of embodiments of the invention.

With reference to FIG. 1 a microwave source 10, which may be a transistor oscillator mounted in a tunable resonant cavity or a programmable synthesizer chip using a suitable VCO (voltage controlled oscillator) digital frequency divider and phase locked loop, produces microwave radiation in about the 2 to 3 GHz range. That radiation is received by an isolator 12 which prevents reflected radiation passing back to the microwave source 10. The isolator 12 passes the radiation to a coupler 14 which splits the radiation such that some of the radiation is directed to a sample arm 16 and a reference arm 18. The sample arm 16 includes an attenuator 20. The attenuator is adjustable to alter the amount of microwave power falling on a sample provided in a resonator 22 which is surrounded by a magnet 24 and modulation coils 26. A circulator 30 receives the radiation from the attenuator 20 and directs the radiation to the loop gap resonator 22 where a sample (not shown) is exposed to the radiation. The encoded radiation is then received by the circulator 30 which directs the radiation to a mixer 32.

The reference arm 18 includes a phase shifter 36 for variable phase shift control of the radiation in the reference arm and an attenuator 38. The phase shifter 36 and the attenuator 20 may receive an electronic control signal on lines 40 from a controller operated by a microprocessor or other computing apparatus. Similarly, the attenuator 38 may also receive an electronic control signal.

In a first embodiment of the invention, the microwave radiation in the reference arm 18 is directed from the attenuator 38 to the mixer 32 on line 42 where it is combined with the radiation received by the circulator 30 from the resonator 22. The output signal from the mixer is a modulated wave form which can be processed by suitable electronic detection circuitry (not shown) to provide an output which can be interpreted. Generally all power in the sample arm is absorbed by the resonator 22 and the sample and reference arms are required to be balanced initially. When a paramagnetic resonance occurs, the bridge becomes unbalanced and the signal is received by input of mixer 32. The reference arm 18 enables the mixer 32 to operate at a suitable level. That radiation is combined with the radiation received from the resonator 22 to effectively maximize the sensitivity of the system.

The isolator 12 and circulator 30 may be two-port and three-port ferrite components, respectively, which are constructed using stripline or microstrip techniques. The phase shifter 36 is preferably electronically controlled.

The resonator 22 is well known from scientific literature and therefore full details will not be described herein.

For general use, the magnet 24 may be an air-cored Helmholz pair magnet capable of linear sweeping up to magnetic fields of about 0.15 Tesla, which is approximately twice the field required to observe ESR from free electrons ($\approx 87$ mT at a microwave frequency of 2.5 GHz), or a small swept electromagnet when portability is not of prime concern. For particular application to radicals or nitroxide spin labels, the magnet 24 is preferably a permanent magnet (e.g. based on Sm-Co alloys) whose field is set to a suitable value below the free electron resonance field and which field can be swept above this value by means of auxiliary coils 26. Such sweeping is preferably under microprocessor or computer control. In whichever magnet embodiment is used, the magnetic field will be modulated at a suitable frequency generally not exceeding 100 kHz to produce a spectral display at that frequency or some harmonic of that frequency. Such coils could consist of approximately 30 turns of 10"/1000 gauge copper wire. For homogeneity, two coils are needed at the Helmholtz condition.

All of the components detailed in FIG. 1, apart from the resonator 22, magnet and coils 24 and 26, can be integrated into a microwave bridge.

The preferred embodiment of the invention is described in greater detail with reference to FIGS. 2 and 3.

Input port 70 is a SMA connector which is coupled to one of the terminals of component 12 and which receives microwave radiation from the microwave source 10 (FIG. 1). The component 12 is preferably a drop-in type circulator which is of conventional design and therefore will not be described in further detail. The second terminal of the circulator is coupled to a Wilkinson divider 14 which performs the function of the coupler 14 described with reference to FIG. 1. The third terminal of component 12 is provided with a 50 ohm termination 72 so that the circulator does in fact act as an isolator to prevent reflection of microwave energy from the Wilkinson divider 14 to the input port 70. Connected between the Wilkinson divider 14 and the isolator 12 is a DC decoupling capacitor 71.

The Wilkinson divider 14 splits the signal received from the second terminal of the isolator 12 so that microwave energy is directed to the reference arm 18 as well as the sample arm 16. The signal which is directed to the reference arm 18 is received by the phase shifter 36. The phase shifter 36 includes a circulator 73 which has a first terminal connected to one of the arms of the Wilkinson divider 14. The second terminal of the circulator 73 is connected to DC decoupling capacitor 74 which in turn is coupled to a transmission line transformer 77 which in turn is coupled to a diode support 78 for supporting a parallel tuned varactor diode (not shown), and a tuner 79 for tuning the diode into parallel resonance. A configuration 75 which acts as an R.F. choke is provided so that a D.C. bias signal can be applied to the diode circuit in such a way that the R.F. and D.C. circuits are decoupled. The signal leaving port 2 of the circulator 73 encounters a reactive load consisting of the parallel tuned varactor diode which reflects the signal back to port 2 and hence to emerge at port 3 and be passed to microwave transmission line 80. The reactive load can be varied by the application of a suitable control voltage to input port 76 in order to adjust the phase of the signal appearing at terminal 3. The third terminal of the circulator 73 is coupled to microwave transmission line 80. The transmission line transformer 77 transforms the impedance of the line up to a suitable level for the most efficient operation of the diode.

The signal from line 80 is received by the attenuator 38 which includes a circulator 81 having its second terminal coupled to PIN diode 82 via a DC decoupling capacitor 83 and microwave transmission line 84. The other end of microwave transmission line 84 is coupled to a 50 ohm termination 85 via DC decoupling capacitor 86. The microwave transmission line 84 is also coupled to a bias network 87 for providing an input current bias signal received at port 88. By suitable application of the current signal from input port 88 to biasing network 87 via line 89 and to terminal 2 of circulator 81, the signal received at terminal 1 can be suitably attenuated and received at terminal 3 for supply to directional coupler 50. The directional coupler 50 is of the transmission line type, comprising a main transmission line 90 and an auxiliary line 94 which is accessed by port 93 via transmission line 91 and terminated with a termination 95. The transmission line directional coupler 50 makes it possible to divert a small fixed proportion of the input signal at port 93 for control and monitoring purposes. The transmission line 90 is coupled to a hybrid branchline coupler 101 and comprises a transmission line circuit arranged in a general rectangular configuration. Arranged at one end of the branchline coupler 101 is a first output port 104 and arranged at the other end of the branchline coupler 101 is a second output port 105. The output port 104 is connected to a termination 106. The output signal received at output port 104 is 90° out of phase with that which is received at output port 105. However, it should be noted that in some embodiments of the invention, a single output port could merely be coupled to the transmission line 90 without the provision of two output signals which vary in phase by 90°.

The reference arm 18 and sample arm 16 are separated by a septum 99 to prevent electromagnetic interference between the two arms.

The sample arm 16 of the spectrometer comprises attenuator 20 which is identical to the attenuator 38 previously described and therefore will not be further detailed herein save to say that the reference numerals used in the attenuator 20 corresponds to those utilized in the attenuator 38. Upon receipt of a suitable current at input port 88 of attenuator 20, the signal at terminal 3 of circulator 81 is received on transmission line 110. Directional coupler 50 is arranged in proximity to transmission line 110 and is identical to the directional coupler 50 arranged in the reference arm 18. The purpose of the directional coupler 50 in the sample arm 16 is the same as that in the reference arm 18. The microwave signal on line 110 is received by circulator 30 which has microwave transmission line 121 connected to its second terminal 2 via DC decoupling capacitor 122. The other end of the line 121 is connected to port 123 which in turn is coupled to loop gap resonator 22 (FIG. 1) so that the radiation can be received by the sample. The radiation is affected by the sample under conditions of paramagnetic resonance and then received by the circulator 30 which directs the radiation from its third terminal 3 to an in phase divider 124 defined by a microwave transmission line which splits the signal and supplies the signal to two ports 125 and 126 having the same phase. The in-phase divider 124 is a second Wilkinson divider.

Figure 2:
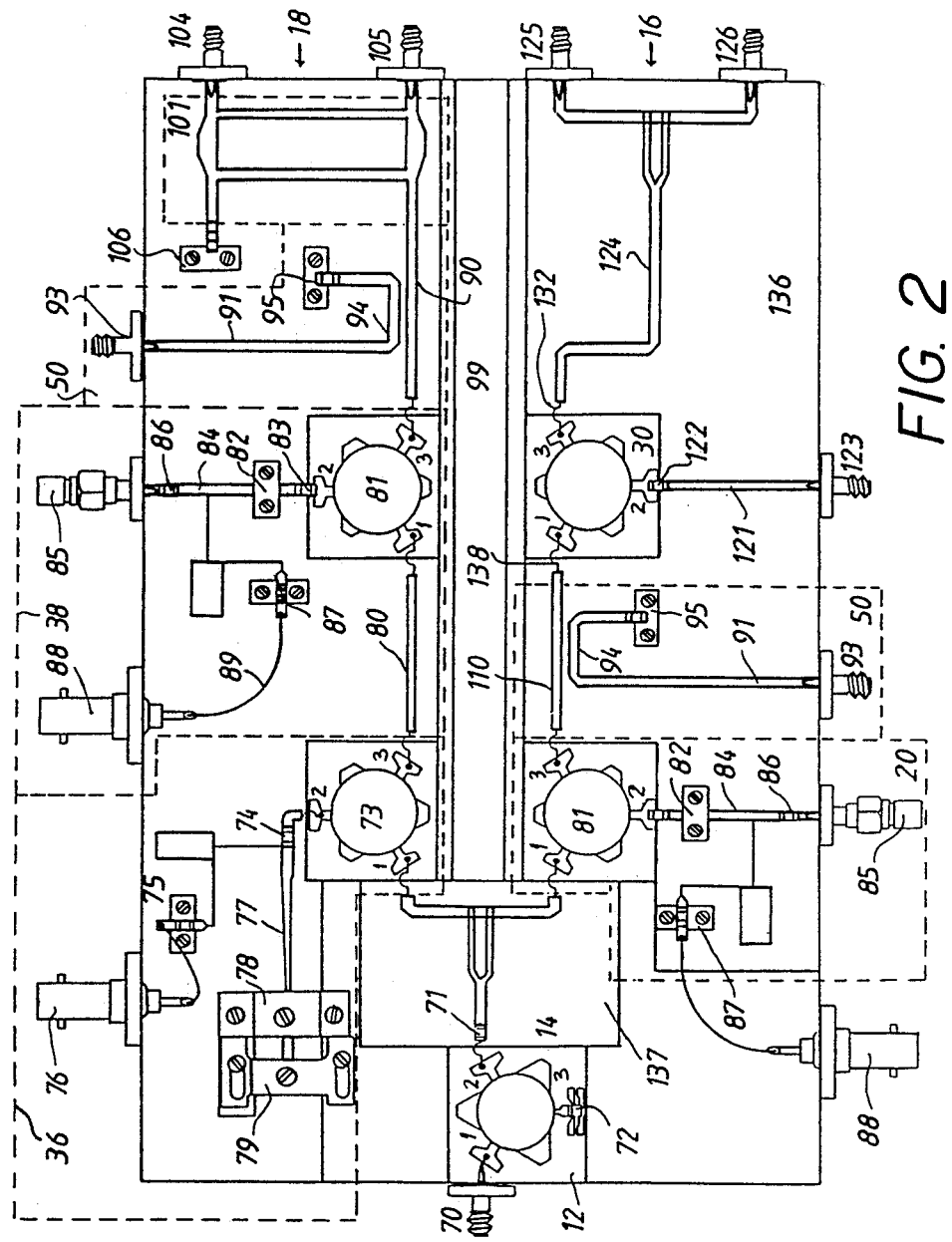
FIG. 2 is a plan view of part of the ESR spectrometer of FIG. 1.
Figure 4:
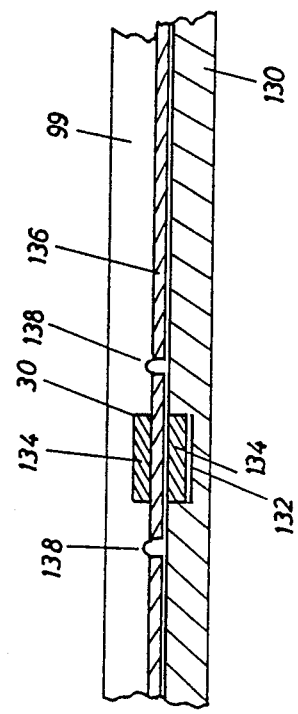
FIG. 4 is a cross-sectional side view along the line 5—5 in FIG. 3.

FIG. 4 shows a cross-sectional view of part of the spectrometer of FIG. 2. The part of the spectrometer shown in FIG. 2 is formed on an aluminium base 130. The base 130 is provided with recesses 132 (only one of which is shown) for receiving one of the magnets 134 of the circulators, such as the circulator 30. Attached to the aluminium base 130 is a microwave substrate 136 which is provided with a copper layer on both of its sides. The board 136 may be coupled to the base 130 by screws, conducting adhesive or any other suitable means. The top copper layer of the board 136 is etched to provide the lines 84, 91, 110, 121 and 124 shown in FIG. 2. Those lines are then coupled to the appropriate terminals of the circulator 30 and the circulator 81 shown in FIG. 2 by copper ribbons 138 or by the DC decoupling capacitor as previously mentioned. In the embodiment shown in FIG. 2, three boards similar to the board 136 are provided. The other two boards 137 and 139 have the Wilkinson divider 14 and the lines 77, 80, 84, 90, 91 and 101 etched thereupon, respectively. It should be understood that while three separate boards are shown in FIG. 2, a single board or more than three boards, for example, could be utilized.

Figure 3:
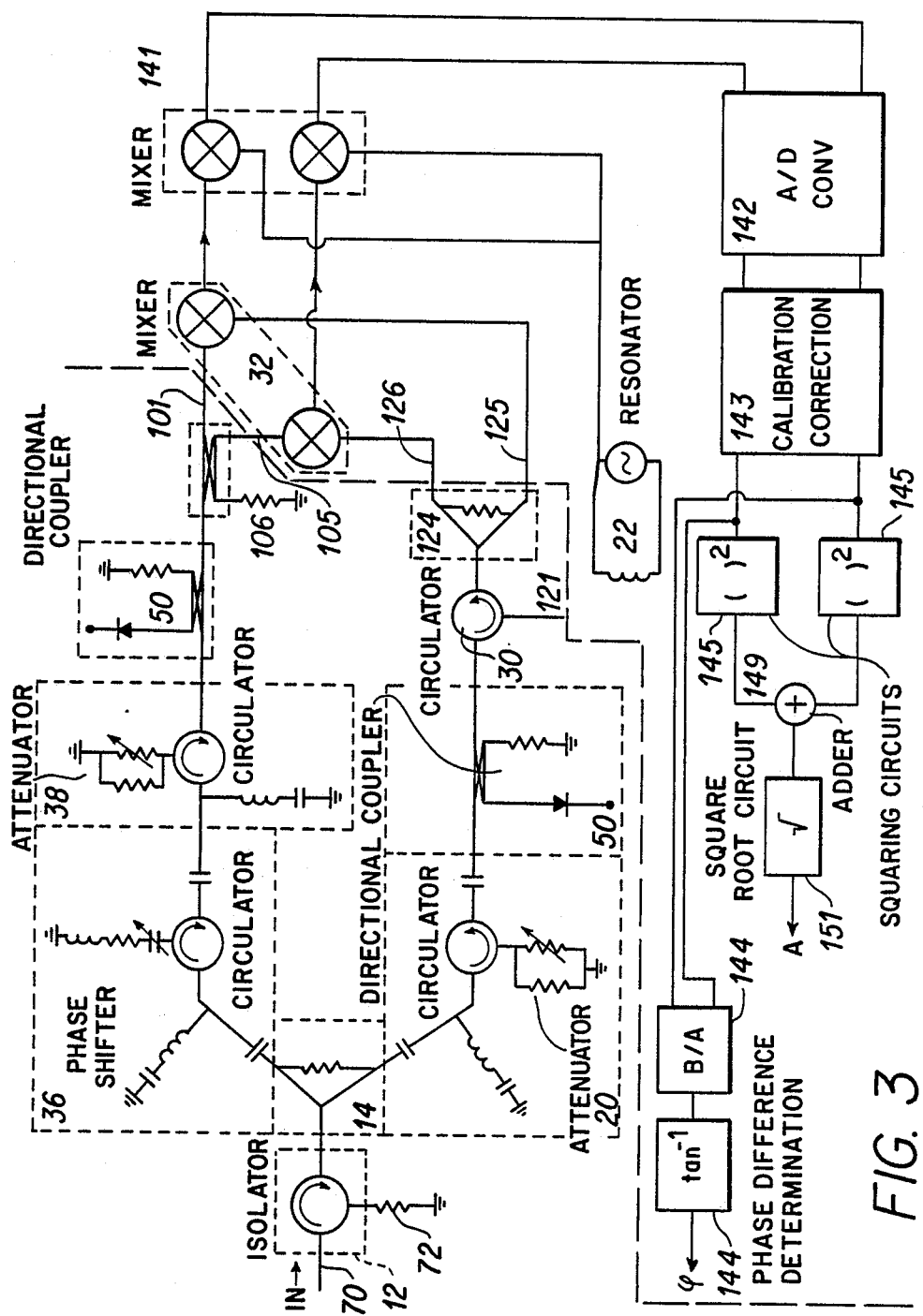
FIG. 3 is a view showing the part of FIG. 1 in the form of an electrical circuit diagram together with the remainder of the ESR spectrometer.

FIG. 3 shows, in electrical form to the left of the dotted line, the structure which has been disclosed with reference to FIG. 2. On FIG. 3 the same reference numerals as used on FIG. 2 have been included.

FIG. 3 also details the detection portion of the embodiment of FIG. 2. The signals which are received at outputs 104, 105, 125 and 126 are applied to two sets of balanced mixers 32 and 141. One of the balanced mixers of mixer set 32 receives the 90° phase shifted signal from the branchline coupler 101 and the signal from the output 125, and the other mixer of mixer set 32 receives the 0° signal from the branchline coupler 101 and the signal from the output 126 from the main or sample arm 16. The first set of balanced mixers 32 discriminates an audio frequency encoded signal from the microwave carrier signal. The output from the balanced mixers 32 is then applied to the second set of balanced mixers 141 where a low frequency carrier is discriminated from the sample signal. The output of the second set of balanced mixers 141 is applied to analog to digital converter 142 and then to a calibration/correction unit 143 which is computer controlled to compensate for any variations in signal which may be detected by the monitoring computer system. The output of the calibration/correction unit 143 is then applied to circuits 144 for determining phase differences between the reference and sample signals so that dispersion and absorption properties of the sample can be determined. Squaring circuits 145 and adding circuit 149 also receive the signal from unit 143 so that an amplitude signal can be determined. A square root circuit 151 may also be provided to produce a magnitude value in a more convenient form. Thus the information which is received is a complete description of the ESR properties of the sample. In addition, it is possible to incorporate signal detection as a function of the phase and frequency of the magnetic field modulation to produce saturation transfer EPR.

Figure 5:
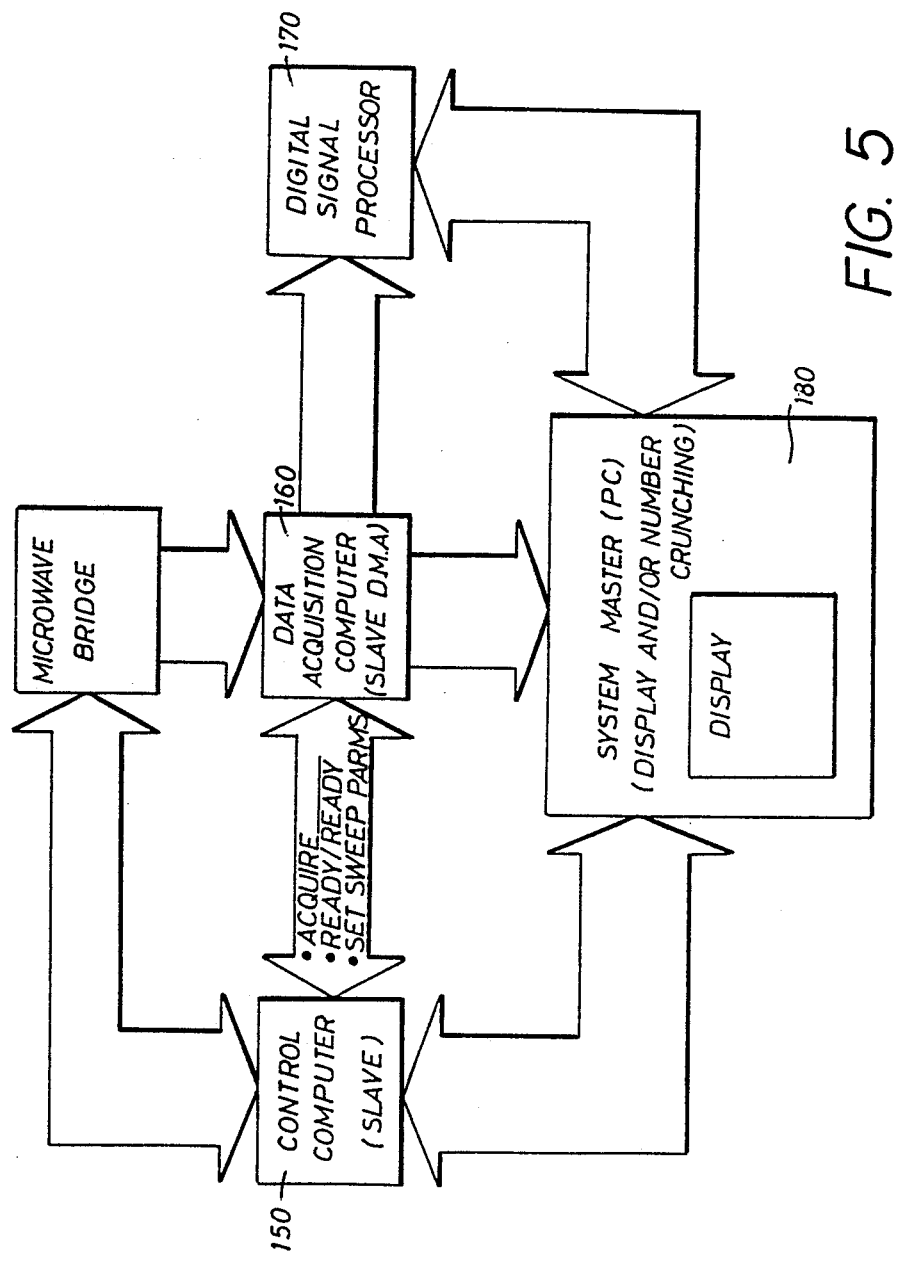
FIG. 5 is a flow sheet showing computer control of the ESR spectrometer.

FIG. 5 shows a flow sheet which generally outlines the computer control of the spectrometer. In FIG. 5 a control the computer 150 is used to control microwave energy level, magnetic field sweeping, and the voltages and currents which are applied to the input ports 76, 88 and 85 of the device shown in FIG. 2. A data acquisition computer 160 is provided for coupling with the control computer unit 150 and the sample cavity for data acquisition and signal processing. Arithmetical operations are performed in a digital signal processor unit 170 and the processor 170, data acquisition computer 160 and control computer 150 are coupled with a master computer 180 for displaying information and providing user input.

Figure 6:
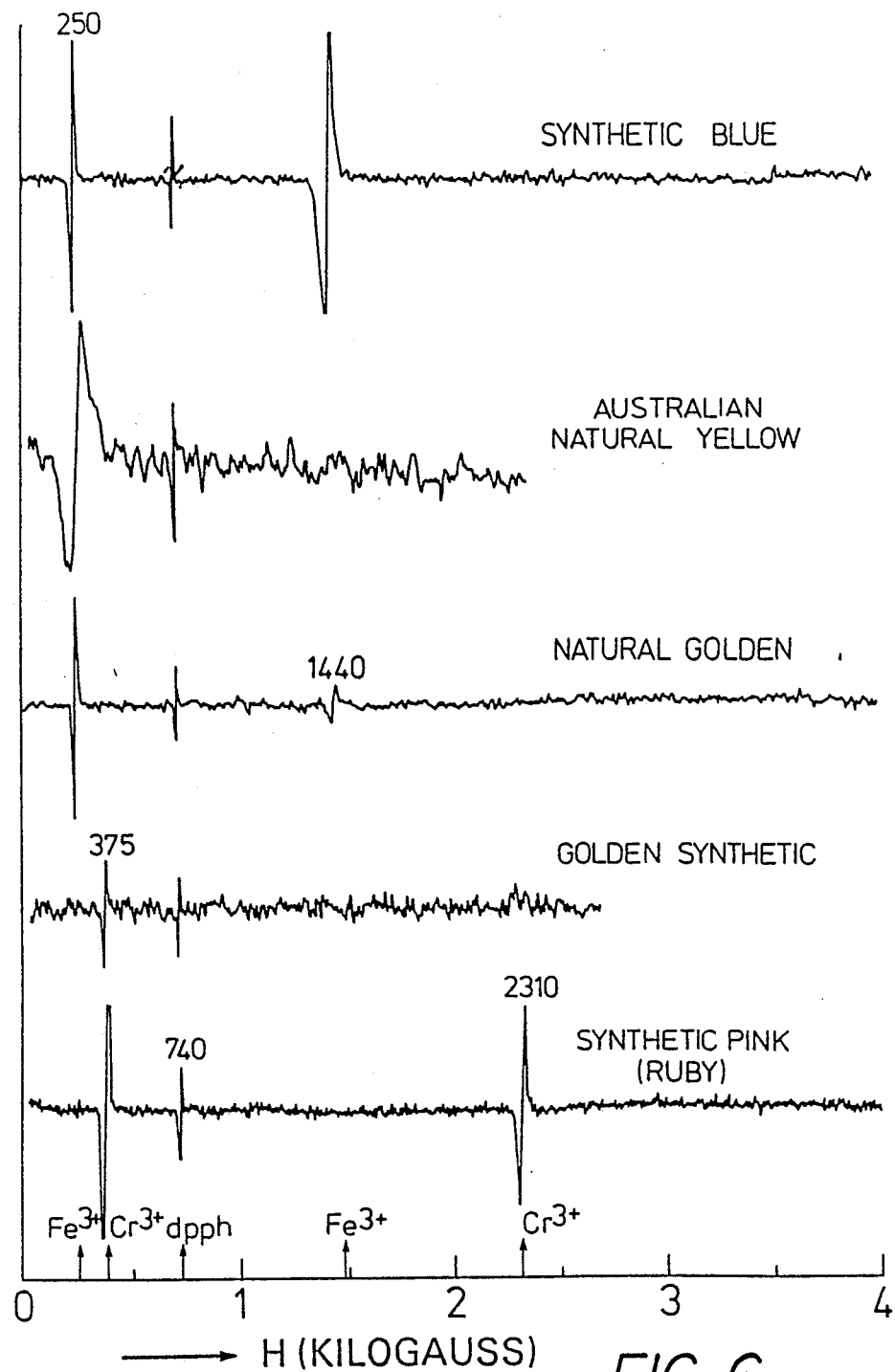
FIG. 6 is a typical output of an ESR spectrometer.

As an example, FIG. 6 shows some typical EPR spectra for sapphires.

The invention can include the attachment of a pulse generator to a microwave switch to be inserted between isolator 12 and coupler 14 (FIG. 1) which would provide means for carrying out time dynamic ESR followed by use of a fast Fourier transform (FFT) on the local computer to generate the spectrum, etc. The compact microwave circuit, in contrast to the bulky waveguide systems conventionally used at 10 GHz, should offer some advantage in terms of reduction in pulse degradation. It would have to be established what effective frequency range was obtained in the FFT of the free induction decay.

In relation to Electron Spin Echo Envelope Modulation studies, the use of lower frequencies (and magnetic fields) should prove beneficial in interpreting frequency dependent line width information in conventional CW ESR and, in the case of proteins, provide a more reliable acid test of the role played by protons distant from the paramagnetic centers.

The pulse mode has the benefit that a fixed magnetoc field provided by a permanent magnet is all that would be needed.

The pulse mode can be implemented with ease owing to the simple nature of the active, electronically-controlled attenuator, which would also be employed for the purpose of switching.

The free-standing microwave bridge could be produced at a given frequency, or range of frequencies, for use as an accessory to any existing commercial special-purpose ESR spectrometer.

Using octave bandwidth design and careful phase compensation, wide band bridge capability should be obtainable.

All systems envisaged are expected to be portable, capable of battery operation, and able to be carried anywhere in the world.

Since modification within the spirit and scope of the invention may readily be effected by persons skilled within the art, it is to be understood that this invention is not limited to the particular embodiment described by way of example hereinabove.

The claims defining the invention are as follows:

1. An electron spin resonance spectrometer for analyzing and determining at least one property of a sample, said spectrometer comprising a microwave source for providing microwave radiation to a sample arm and to a reference arm, said sample arm having a first circulator for directing the radiation to a resonator in which the sample for analysis is deposited and for receiving the radiation from said resonator and directing the radiation to a detector, said detector detecting the radiation from said sample arm and said reference arm to determine the property or properties of the sample, said sample arm and said reference arm being formed as an integrated microwave bridge.

2. A spectrometer according to claim 1, further including an isolator for receiving the microwave radiation from said microwave source and for substantially preventing reflected portions of the radiation from returning to said source, a divider for directing a portion of the radiation to said sample arm and said reference arm, a first attenuator arranged in said sample arm between said divider and said first circulator, and a phase shifter and a second attenuator arranged in said reference arm between said divider and said detector.

3. A spectrometer according to claim 2, wherein:
said divider has a first output portion coupled to said first attenuator, said first attenuator being coupled to said first circulator by a first microwave transmission line, said first circulator being operatively coupled to a first spectrometer output by a second microwave transmission line; and
said divider has a second output portion coupled to said phase shifter, said phase shifter including a second circulator and said second attenuator including a third circulator, said second circulator being coupled to said third circulator by a third microwave transmission line, said third circulator being coupled to a second spectrometer output by a fourth microwave transmission line.

4. A spectrometer according to claim 3, wherein said sample arm includes a directional coupler, said directional coupler comprising said first microwave transmission line and a fifth microwave transmission line which has an output terminal at one end and a termination at another end, a portion of said fifth transmission line being arranged in proximity to said first transmission line such that a signal on said first microwave transmission line is induced in the fifth microwave transmission line.

5. A spectrometer according to claim 3, wherein said reference arm includes a directional coupler, said directional coupler including a portion of said fourth microwave transmission line and a sixth microwave transmission line, at least a portion of said sixth microwave transmission line being arranged in proximity to said fourth microwave transmission line so that a signal on said fourth microwave transmission line is induced in said sixth microwave transmission line, one end of said sixth microwave transmission line being coupled to a third spectrometer output and another end being coupled to a termination.

6. A spectrometer according to claim 3, wherein said divider comprises a microwave transmission line.

7. A spectrometer according to any one of claims 3 to 6, wherein said microwave transmission lines are etched from a conductive substrate.

8. A spectrometer according to claim 3, wherein said first spectrometer output comprises a first pair of output ports which receive a a first and a second portion of the radiation, respectively, the first and second portions of the radiation having the same phase, and wherein said second spectrometer output comprises a second pair of output ports which receive a third and a fourth portion of the radiation, respectively, the third and fourth portions of the radiation having a phase difference of 90°.

9. A spectrometer according to claim 8, wherein one of said output ports of said first pair and one of said output ports of said second pair are coupled to a first balanced mixer and the other output port of said first pair and the other output port of said second pair are coupled to a second balanced mixer, said first and second balanced mixers being coupled to a third and a fourth balanced mixer, respectively, and said third and fourth balanced mixers being coupled to said detector.

10. A spectrometer according to claim 9, wherein said detector comprises means for determining both the phase and magnitude of the first, second, third and fourth portions of the radiation received at said respective output ports to determine both absorption and dispersion characteristics of the sample.

11. A spectrometer according to claim 1, wherein the detector comprises two pairs of balanced mixers, an anlog-to-digital converter coupled to said mixers, a calibration and correction unit coupled to said converter, a pair of squaring circuits coupled to said calibration and correction unit, an adding circuit coupled to said squaring circuits to determine absorption characteristics of the sample, and phase difference determining circuits coupled to said calibration and correction unit to determine dispersion characteristics of the sample.

12. A spectrometer according to claim 1, wherein said microwave bridge comprises an integrated microstrip microwave bridge.

13. An electron spin resonance spectrometer for analyzing and determining at least one property of a sample, said spectrometer comprising:
a microwave source for providing microwave radiation;
dividing means coupled to said microwave source for dividing the radiation into a sample portion and a reference portion;
a sample arm coupled to said dividing means for exposing the sample to the sample radiation portion, said sample arm including,
a circulator coupled to said dividing means, and
a resonator coupled to said circulator and containing the sample, said resonator receiving the sample radiation portion from said circulator and returning the sample radiation portion to said circulator;

a reference arm coupled to said dividing means for selectively interacting with the reference radiation portion, said sample arm and said reference arm together forming an integrated microwave bridge; and detecting means operatively coupled to said resonator of said sample arm and to said reference arm for detecting and processing said sample radiation portion and said reference radiation portion to determine the at least one property of the sample.

14. A spectrometer according to claim 13, wherein said microwave bridge comprises an integrated microstrip microwave bridge.

15. A spectrometer according to claim 13, wherein said sample arm further includes isolating means operatively coupled to said divider and to said circulator for substantially preventing parts of the sample radiation portion in said circulator from returning to said microwave source.

16. A spectrometer according to claim 13, wherein said sample arm further includes attenuation means operatively coupled to said dividing means and to said circulator for attenuating the sample radiation portion.

17. A spectrometer according to claim 13, wherein said reference arm includes phase shifting means operatively coupled to said dividing means and to said detection means for shifting the phase of the reference radiation portion.

18. A spectrometer according to claim 13, wherein said reference arm includes attenuation means for attenuating the reference radiation portion.

19. A spectrometer according to claim 13, wherein said sample arm further includes directional coupling means operatively coupled to said dividing means and to said circulator for directionally coupling said dividing means to said circulator.

20. A spectrometer according to claim 13, wherein said reference arm includes directional coupling means operatively coupled to said dividing means and to said detecting means for directionally coupling said dividing means to said detecting means.

21. A spectrometer according to claim 13, wherein:

said sample arm includes directional coupling means operatively coupled to said dividing means and to said circulator for directionally coupling said dividing means to said circulator, and means operatively coupled to said detecting means for converting said sample radiation portion into a first radiation portion and a second radiation portion, said first and said second radiation portions being in phase with one another; and said reference arm includes directional coupling means operatively coupled to said dividing means and to said detecting means for directionally coupling said dividing means to said detecting means, and means operatively coupled to said detecting means for converting said reference radiation portion into a third radiation portion and a fourth radiation portion, said third and said fourth radiation portions having a phase difference of 90°.

22. A spectrometer according to claim 21, wherein said detection means includes four balanced mixers:

a first one of said balanced mixers being coupled to said sample arm to receive one of said first and said second radiation portions and coupled to said reference arm to receive one of said third and said fourth radiation portions;

a second one of said balanced mixers being coupled to said sample arm to receive the other of said first and said second radiation portions and coupled to said reference arm to receive the other of said third and fourth radiation portions;

a third one of said balanced mixers being coupled to said first balanced mixer; and a fourth one of said balanced mixers being coupled to said second balanced mixer.

* * * * *